(12) United States Patent
Gray et al.

(10) Patent No.: US 7,972,919 B2
(45) Date of Patent: Jul. 5, 2011

(54) VERTICAL PNP TRANSISTOR AND METHOD OF MAKING SAME

(75) Inventors: Peter B. Gray, Essex Junction, VT (US); Benjamin T. Voegeli, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 507 days.

(21) Appl. No.: 11/160,956

(22) Filed: Jul. 18, 2005

(65) Prior Publication Data

US 2007/0013031 A1    Jan. 18, 2007

(51) Int. Cl.
   *H01L 21/8234*    (2006.01)
(52) U.S. Cl. ........ 438/202; 438/203; 438/969; 438/417; 438/322
(58) Field of Classification Search .................. 438/202, 438/203, 969, 417, 322
   See application file for complete search history.

(56) References Cited

U.S. PATENT DOCUMENTS

| | | | |
|---|---|---|---|
| 4,997,776 A * | 3/1991 | Harame et al. | 438/313 |
| 6,297,119 B1 | 10/2001 | Tsutsui et al. | |
| 6,303,420 B1 | 10/2001 | Sridhar et al. | |
| 6,359,317 B1 | 3/2002 | Carroll et al. | |
| 2003/0102512 A1 | 6/2003 | Chatterjee | |
| 2004/0046183 A1 | 3/2004 | Chatterjee | |
| 2004/0051147 A1 | 3/2004 | Panday et al. | |
| 2004/0099895 A1 * | 5/2004 | Gray et al. | 257/302 |
| 2004/0262715 A1 | 12/2004 | Miura et al. | |
| 2009/0075447 A1 * | 3/2009 | Meunier-Beillard et al. | 438/378 |

FOREIGN PATENT DOCUMENTS

CN        1514494 A        7/2004

* cited by examiner

*Primary Examiner* — Samuel A Gebremariam
(74) *Attorney, Agent, or Firm* — Scully, Scott, Murphy & Presser, P.C.; Richard M. Kotulak, Esq.

(57) ABSTRACT

The present invention relates to a device structure located in a semiconductor substrate and containing high performance vertical NPN and PNP transistors. Specifically, the vertical PNP transistor has an emitter region, and the vertical NPN transistor has an intrinsic base region. The emitter region of the vertical PNP transistor and the intrinsic base region of the vertical NPN transistor are located in a single silicon germanium-containing layer, and they both contain single crystal silicon germanium. The present invention also relates to a method for fabricating such a device structure based on collateral modification of conventional fabrication processes for CMOS and bipolar devices, with few or no additional processing steps.

13 Claims, 7 Drawing Sheets

VERTICAL PNP TRANSISTOR AND METHOD OF MAKING SAME

FIELD OF THE INVENTION

The present invention relates to a device structure containing high performance vertical PNP and NPN transistors, and a method for forming the same.

BACKGROUND OF THE INVENTION

The ever-increasing use of mobile communications is driving improvements in radio frequency (RF) communications. In particular, this expanding market is demanding lower power consumption and increased performance. One possible solution that has found many applications is bipolar complementary metal-oxide semiconductor (BiCMOS) technology. See, e.g., Chyan et al., "A 50 GHz 0.25 µm . . . BiCMOS Technology for Low-Power Wireless-Communication VLSI's," BCTM, 1998, page 128.

However, many BiCMOS circuit designs are limited in terms of speed, power consumption, and noise, because only high performance vertical NPN transistors are currently available. Low performance lateral PNP transistors are available, which have a cutoff threshold ($f_T$) of less than 1 GHz and cannot compliment the high-speed NPN bipolar devices for forming push-pull circuits. There is therefore a continuing need in the art for high performance PNP transistors. See, e.g., D. M. Monticelli, "The Future of Complementary Bipolar," BCTM, 2004, page 21.

Further, it is expensive to integrate the PNP transistors into a conventional BiCMOS process that is designed to form only complementary metal-oxide-semiconductor (CMOS) devices and NPN bipolar devices. Additional processing steps are typically required for forming PNP transistors, which result in prolonged processing time and increased manufacturing costs. Therefore, a need also exists for a method for integrating PNP transistor processing steps into a conventional BiCMOS process, with few or no additional processing steps.

SUMMARY OF THE INVENTION

In one aspect, the present invention relates to a device structure located in a semiconductor substrate. Specifically, the inventive device structure comprises:
 a vertical PNP transistor having an emitter region; and
 a vertical NPN transistor having an intrinsic base region,
 wherein the emitter region of the vertical PNP transistor and the intrinsic base region of the vertical NPN transistor both comprise single crystal structures and are located in a single silicon germanium-containing layer.

Preferably, the emitter region of the vertical PNP transistor is substantially aligned with the intrinsic base region of the vertical NPN transistor along a direction parallel to a top surface of an underlying semiconductor substrate.

The term "substantially aligned" as used herein refers to the alignment of two layers or two surfaces along a specific direction, with an offset of less than 50% of the average thickness of the two aligned layers or less than 50% of the average surface area of the two aligned surfaces along the specific direction.

In another aspect, the present invention relates to a method for forming a vertical PNP transistor as described hereinabove in a semiconductor substrate while forming a CMOS device and a vertical NPN transistor, said method comprising:

a first step or set of steps for concurrently forming at least a first portion of the CMOS device or the vertical NPN transistor and a collector region of the vertical PNP transistor;
 a second step or set of steps for concurrently forming at least a second portion of the CMOS device or the vertical NPN transistor and an intrinsic base region of the vertical PNP transistor;
 a third step or set of steps for concurrently forming at least a third portion of the CMOS device or the vertical NPN transistor and an extrinsic base region of the vertical PNP transistor; and
 a fourth step or set of steps for concurrently forming at least a portion of the vertical NPN transistor and an emitter region of the vertical PNP transistor.

The CMOS device is preferably, but not necessarily, an n-channel field effect transistor (NFET) or a p-channel field effect transistor (PFET).

Other aspects, features and advantages of the invention will be more fully apparent from the ensuing disclosure and appended claims.

DETAILED DESCRIPTIONS OF THE INVENTION, AND PREFERRED EMBODIMENTS THEREOF

Figure 1:
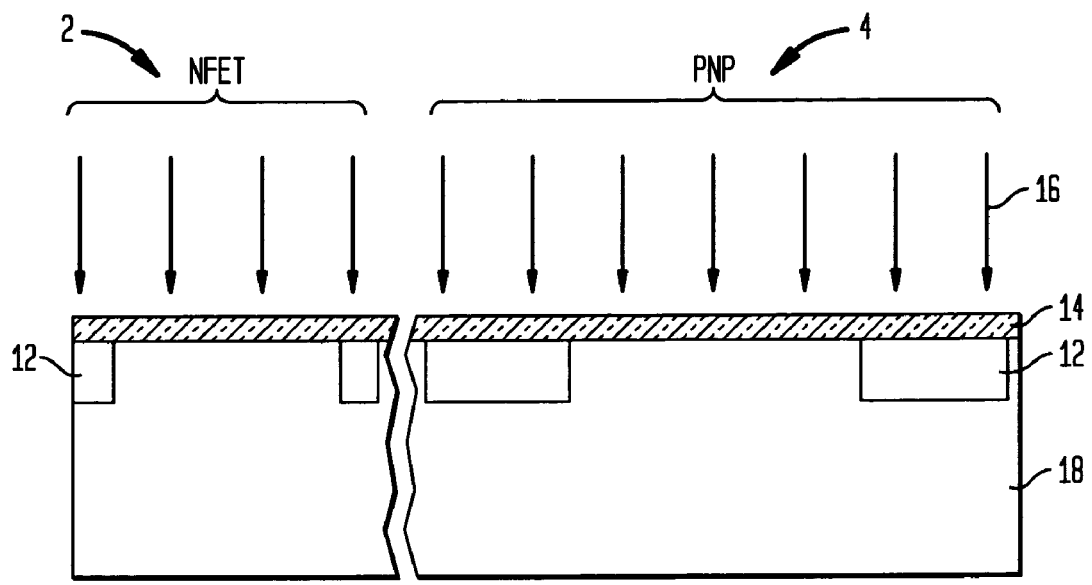
FIG. 1 shows a first step of an inventive method for concurrently forming n-type isolation structures for both an NFET and a vertical PNP transistor, according to one embodiment of the present invention.

The following U.S. patent and U.S. patent application publications are incorporated herein by reference in their entireties for all purposes:

U.S. Pat. No. 5,111,271 issued on May 5, 1992 for "SEMICONDUCTOR DEVICE USING STANDARD CELL SYSTEM", U.S. patent application Ser. No. 10/065,837 filed on May 27, 2004 for "HIGH PERFORMANCE VERTICAL PNP TRANSISTOR AND METHOD," which was published on May 27, 2004 as U.S. Patent Application Publication No. 2004/0099895; and U.S. patent application Ser. No. 10/863,630 filed on Jun. 8, 2004 for "HIGH PERFORMANCE VERTICAL PNP TRANSISTOR METHOD," which was published on Dec. 9, 2004 as U.S. Patent Application Publication No. 2004/0248352.

The present invention provides a method for fabricating a high performance vertical PNP transistor, by utilizing a novel combination of existing processing steps from conventional SiGe BiCMOS technology that was designed to form only CMOS devices, such as n-channel or p-channel field effect transistors (NFET or PFET), and bipolar NPN transistors.

The method of the present invention requires only collateral modification of the conventional SiGe BiCMOS fabrication process, with few or no additional processing steps, and the resulting vertical PNP transistor demonstrates significantly enhanced performance (e.g., having a cutoff frequency $f_T>1$ GHz) in comparison to the low performance lateral PNP transistors provided by prior art BiCMOS technology.

Therefore, the device structure and the fabrication process described herein constitute an important advancement in the art over the costly and poor-performing PNP solutions employed by the prior art BiCMOS technology.

Preferably, the method of the present invention concurrently fabricates a vertical PNP transistor, one or more CMOS devices (such as NFETs and PFETs), and one or more vertical NPN transistors. More preferably, every processing step in this method is an existing processing step from conventional SiGe BiCOMS technology, and no additional processing step is required for forming the vertical PNP transistor.

For example, the substrate or the existing p-well implant of the conventional BiCMOS process can be used to form the p-type collector region of the vertical PNP transistor of the present invention. The intrinsic base region of the vertical PNP transistor can be formed by using existing n-type ion implantation steps, such as the NFET extension implants, PFET halo implants, or NPN collector pedestal implants, which are commonly employed by the conventional SiGe BiCMOS technology, while the extrinsic base of the vertical PNP transistor of the present invention can be formed by using the existing N+ NFET source/drain implants and/or the existing NFET extension implants.

After formation of the collector and base regions as described hereinabove, a layered insulating structure normally used for the bipolar NPN process, which contains one or more silicon dioxide layers and/or one or more silicon nitride layers, is provided to serve as the emitter-base dielectric insulator for the vertical PNP transistor of the present invention. A selective etching step typically used for forming etch windows for subsequent NPN device fabrication is hereby employed to form a PNP emitter window through the layered insulating structure.

Subsequently, a silicon germanium-containing layer is epitaxially grown at low temperature (e.g., less than about 700° C.) over both the PNP emitter window and the NPN device window to form a single crystal emitter for the PNP transistor and a single crystal intrinsic base for the NPN transistor, respectively. Preferably, the silicon germanium-containing layer is also grown in regions outside the PNP emitter window and the NPN device window to form polycrystalline structures in such outside regions.

The low temperature epitaxial growth of the silicon germanium-containing layer is followed by a single p-type ion implantation that concurrently forms a polycrystalline extrinsic base for the vertical NPN transistor and increases doping concentration of the single crystal emitter of the vertical PNP transistor to a suitable level for the device.

In addition, the vertical PNP device so formed can be isolated from the substrate to enhance the alternating current (AC) performance of the device and reduce noise coupling with other devices on the wafer. The device isolation can be achieved by using the existing n-well region implants that have already been utilized to make isolated triple-well NFET transistors in conventional CMOS process.

The resulting high performance vertical PNP transistor thus includes collector and base regions formed by ion implantation, an emitter window formed by selectively etching through a layered insulator structure, and an emitter region formed by using the SiGe low temperature epitaxy (LTE) techniques.

Specifically, the vertical PNP transistor of the present invention has a single crystal emitter region that contains silicon and germanium, while a concurrently formed vertical NPN transistor includes a single crystal intrinsic base region that contains silicon and germanium. Both the emitter region of the vertical PNP transistor and the intrinsic base region of the vertical NPN transistor are located in the same silicon germanium-containing layer.

The emitter region of the vertical PNP transistor formed by the method of the present invention is significantly "raised," in comparison with prior art PNP emitters, i.e., the emitter region of the vertical PNP transistor formed in the present invention is substantially aligned with the intrinsic base region of the concurrently formed vertical NPN transistor, while emitters of the prior art PNP transistors are typically significantly lower than the intrinsic base of the adjacent NPN transistor.

The method of the present invention adds no additional step or steps to conventional SiGe fabrication processes for CMOS and bipolar devices, thus representing minimum modification to the entire process flow.

In the accompanying drawings FIGS. 1-13, various exemplary fabrication process steps of the method of the present invention, as described hereinabove, are illustrated, according to one embodiment of the present invention, for concurrent fabrication of a vertical PNP transistor, an NFET device, and a vertical NPN transistor based on collateral modification of the conventional SiGe BiCMOS fabrication processes. Throughout the drawings, an NFET region 2 in which an NFET will be created or an NPN region 6 in which a vertical NPN transistor will be created is shown on the left, and a PNP region 4 in which a vertical PNP transistor will be created is shown on the right.

It should be recognized that the drawings of the present invention are provided for illustrative purposes and are not drawn to scale. Further, it should be recognized that some of the steps of fabrication according to conventional SiGe technology have been omitted for brevity and clarity, while some of the conventional SiGe technology fabrication steps have been included in the illustration, but these steps do not necessarily form a part of the invention.

In FIG. 1, a semiconductor substrate that contains shallow trench isolation regions 12 and a silicon dioxide layer 14 is provided, to which an n-type ion implant 16 is applied to form an n-type isolation layer 18.

Figure 2:
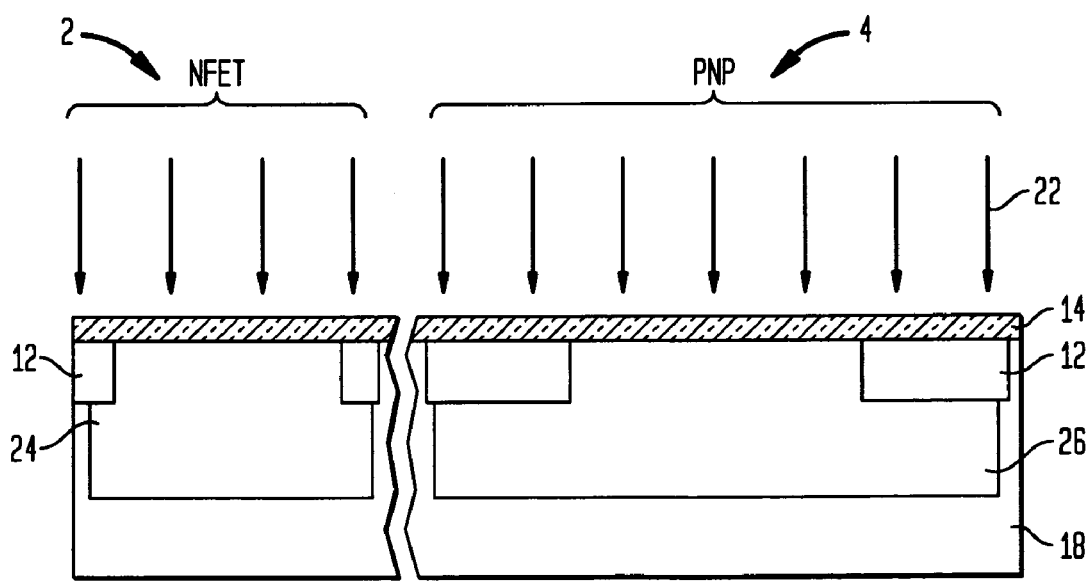
FIG. 2 shows a second step of the inventive method for concurrently fabricating p-well implants for the NFET and a collector for the vertical PNP transistor, according to one embodiment of the present invention.

Subsequently, a p-type ion implant 22 is applied to the semiconductor substrate to form p-well 24 for the NFET 2 on the left. The p-type ion implant 22 concurrently forms a collector region 26 (p-type) for the PNP transistor 4 on the right, as shown in FIG. 2. One or more collector contacts (not shown) are provided for the collector region 26. Further, patterned photoresist (not shown) is formed over certain areas of the n-type isolation layer 18, the p-well 24, and/or the collector region 26, so as to mask such areas from subsequent processing steps, while other areas are exposed for further processing.

The n-type material used here, and throughout this description, may be any well-known or later developed material for the n-type ion implantation, such as arsenic, phosphorous, antimony, or a combination of these materials. Similarly, the p-type material used here, and throughout this description, may be any well-known or later developed material for the p-type ion implantation, such as boron, boron fluoride, indium, or a combination of these materials.

Figure 3:
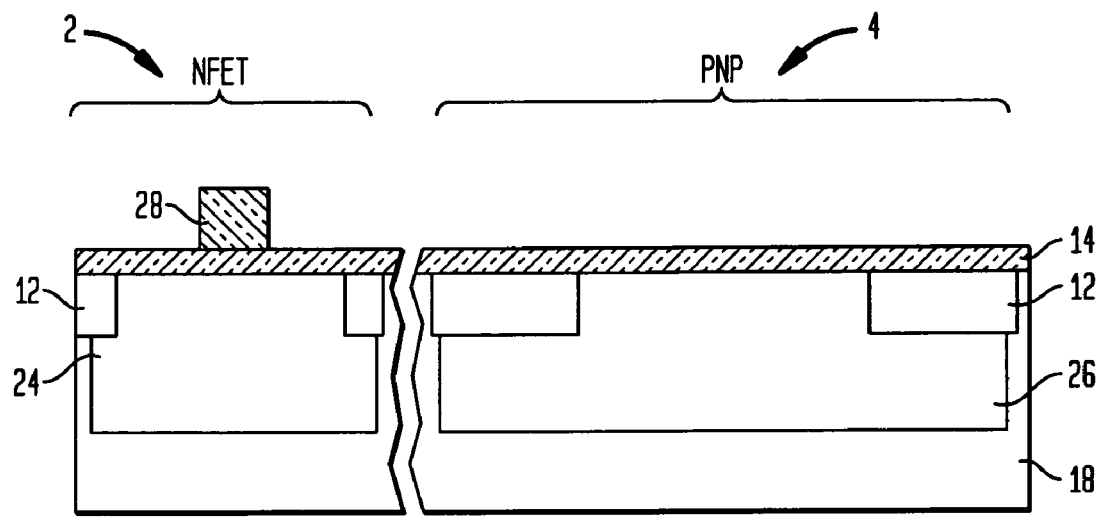
FIG. 3 shows a third step of the inventive method for fabricating a polysilicon gate structure for the NFET, according to one embodiment of the present invention.
Figure 4:
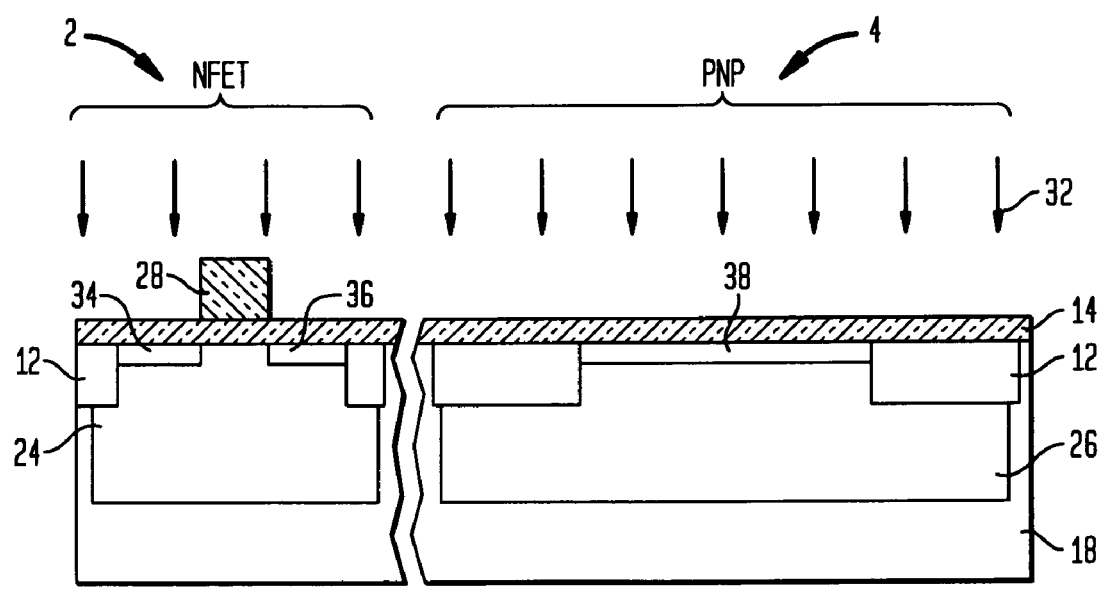
FIG. 4 shows a fourth step of the inventive method for concurrently fabricating extension implants for the NFET and an intrinsic base for the vertical PNP transistor, according to one embodiment of the present invention.

FIG. 3 shows fabrication of a polysilicon gate structure 28 for the NFET 2 over the silicon dioxide layer 14. FIG. 4 shows subsequent application of an n-type ion implant 32, which forms source and drain extension regions 34 and 36 (n-type, lightly doped) for the NFET 2 on the left, and also intrinsic base region 38 (n-type, lightly doped) for the PNP transistor 4 on the right.

Figure 5:
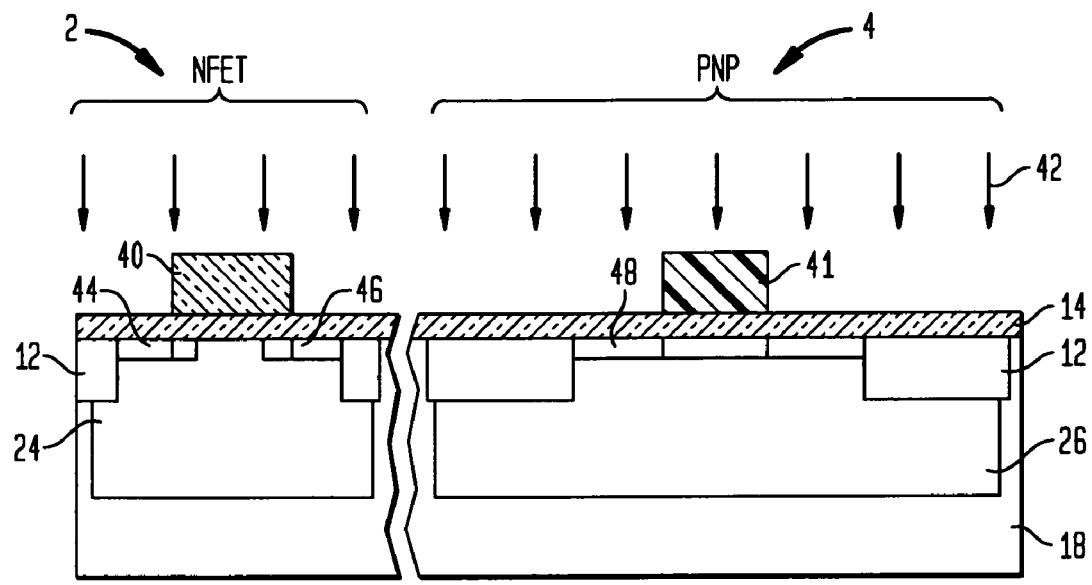
FIG. 5 shows a fifth step of the inventive method for concurrently fabricating source/drain implants for the NFET and an extrinsic base for the vertical PNP transistor, according to one embodiment of the present invention.

The polysilicon gate structure 28 is then replaced by a wider polysilicon gate structure 40, and a photoresist 41 is provided to cover a portion of the intrinsic base 38. Note that the photoresist 41, and any other photoresist used herein, may be any well-known or later-developed photoresist material. In such a manner, further application of an n-type ion implant 42 concurrently forms the source and drain regions 44 and 46 (n-type, heavily doped) for the NFET 2 on the left and the extrinsic base region 48 (n-type, heavily doped) for the PNP transistor 4 on the right, as shown in FIG. 5.

As shown in FIG. 1-5, the collector region 26, the intrinsic base region 38, and the extrinsic base region 48 of the vertical PNP transistor 4 can be readily fabricated by existing ion implantation steps that have been typically used in a conventional CMOS process to form NFET devices. Alternatively, the collector, intrinsic base, and extrinsic base regions of the PNP transistor can be formed by other existing CMOS or bipolar device processing steps. For example, the intrinsic base region can also be formed by using PFET halo implants or NPN collector pedestal implants, while the extrinsic base region can also be formed by the NFET extension implants.

The emitter region for the vertical PNP transistor 4, on the other hand, can be readily fabricated by utilizing existing processing steps that have been typically used in the conventional SiGe BiCMOS process to form vertical NPN transistors, as illustrated in FIG. 6-13. These processing steps are outlined in U.S. Pat. No. 5,111,271, which has been incorporated by reference. It should be recognized that these steps may vary somewhat as the device fabrication scheme is adapted to different applications.

Figure 6:
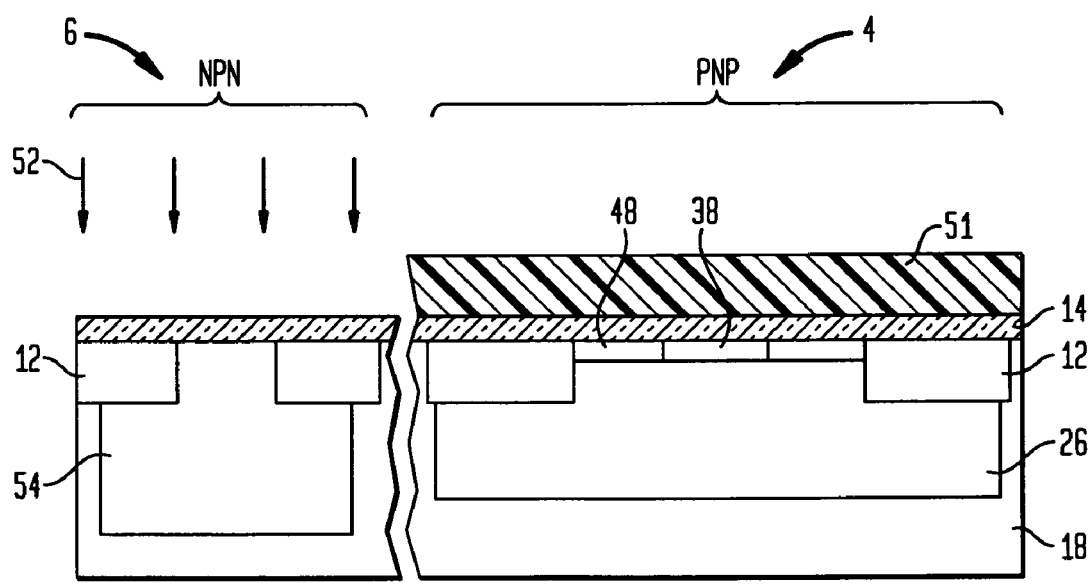
FIG. 6 shows a sixth step of the inventive method for fabricating a sub-collector for a vertical NPN transistor, according to one embodiment of the present invention.

Specifically, FIG. 6 shows formation of a sub-collector 54 for a NPN transistor 6 by n-type ion implantation 52. During this processing step, the vertical PNP transistor 4 is covered by a photoresist 51 so that it is not exposed to the n-type ion implantation 52. After the n-type ion implantation, the photoresist 51 can be readily removed from the PNP transistor 4 by a conventional resist-stripping step.

Figure 7:
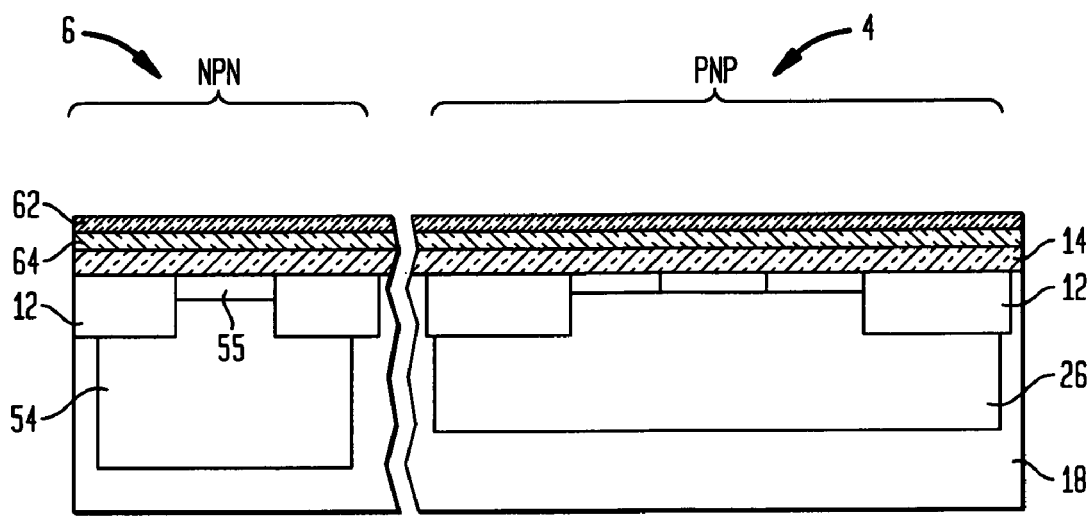
FIG. 7 shows a seventh step of the inventive method for forming a layered insulator structure, which protects existing FET devices from subsequent processing steps for fabricating the vertical NPN transistor and also forms an emitter-base insulator structure for the vertical PNP transistor, according to one embodiment of the present invention.

FIG. 7 shows a subsequent step in which a layer of silicon nitride 64 (hereinafter "nitride") is deposited followed by a layer of oxide 62. A number of other structures may also be created for the NPN transistor 6 prior to this step, among which is the collector region 55 that can be readily formed by an n-type ion implantation step. The oxide layer 62, the nitride layer 64 and the silicon dioxide layer 14 together form a layered insulator structure, which is typically used for protecting FET structures during the NPN fabrication steps in the conventional BiCMOS process, and which is used by the present invention to form an emitter-base insulator structure for the vertical PNP transistor 4.

Figure 8:
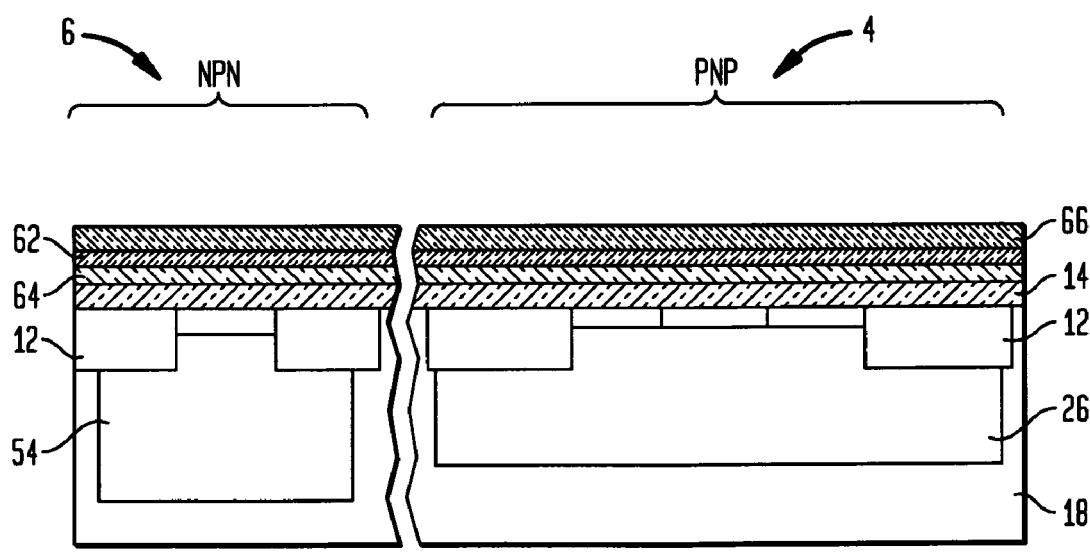
FIG. 8 shows an eighth step of the inventive method for depositing a polysilicon seed layer over the layered insulator structure as formed in FIG. 7, according to one embodiment of the present invention.

FIG. 8 shows a step in which a polysilicon seed layer 66 is deposited over the layered insulator structure as described hereinabove. Polysilicon layer 66 may be no less than 10 nm and no more than 100 nm, and is typically approximately 45 nm.

Figure 9:
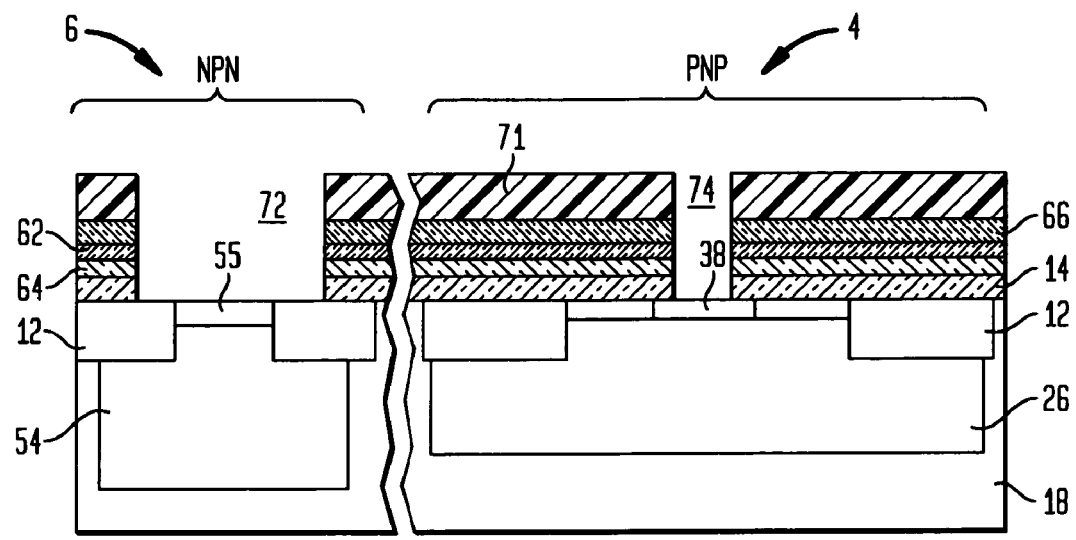
FIG. 9 shows a ninth step of the inventive method for concurrently forming an etch window for subsequent fabrication of the vertical NPN transistor and an etch window for subsequent fabrication of an emitter for the vertical PNP transistor, according to one embodiment of the present invention.

Subsequently, a selective etching step is applied, as illustrated in FIG. 9, in which regions of the NPN transistor 6 and the PNP transistor 4 are masked by a patterned photoresist layer 71, and un-masked regions are selectively etched to remove a part of the polysilicon seed layer 66, the oxide layer 62, the nitride layer 64, and the oxide layer 14, thereby forming a first etch window 72 in the NPN transistor 6 that exposes an upper surface of the NPN collector 55 and a second etch window 74 in the PNP transistor 4 that exposes an upper surface of the PNP intrinsic base 38. Subsequently, the photoresist 71 is removed by a conventional resist-stripping step (not shown).

Figure 10:
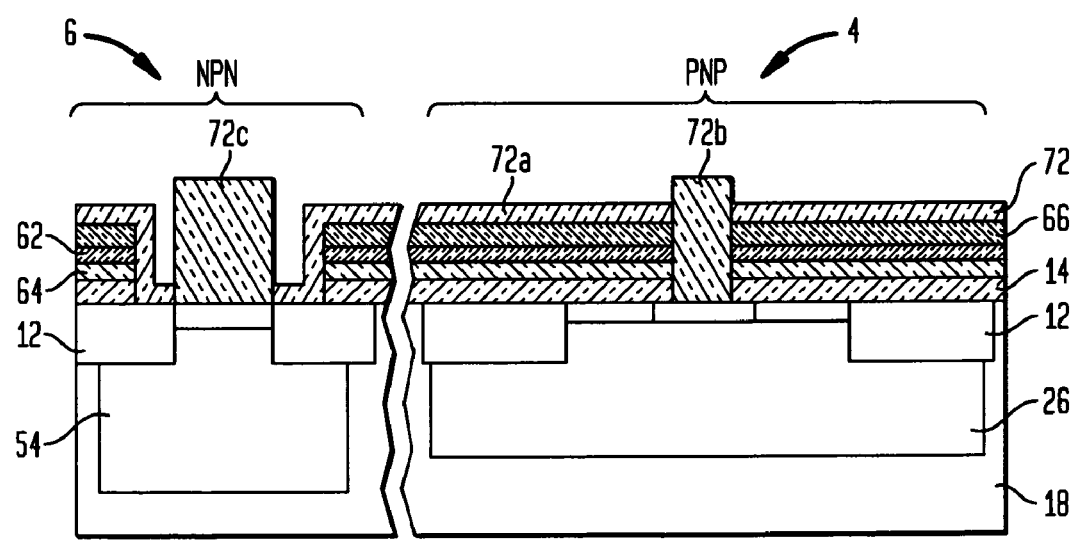
FIG. 10 shows a tenth step of the inventive method for low temperature epitaxial deposition of a silicon germanium-containing layer to concurrently form a single crystal intrinsic base for the vertical NPN transistor and a single crystal emitter for the vertical PNP transistor, according to one embodiment of the present invention.

In the next step, as shown in FIG. 10, an epitaxial layer 72 of silicon-germanium (SiGe) is grown at low temperature over the entire wafer. As the epitaxial layer 72 grows, the SiGe grows as a single crystal structure 72b over the PNP intrinsic base 38 and a single crystal structure 72c over the NPN collector 55 since it is in contact with silicon, but grows a poly-crystalline structure 72a over the polysilicon seed layer 66. The resulting layer 72 preferably has a germanium content of no less than 10 atomic % and no more than 30 atomic % of the combined silicon and germanium composition. During the low temperature epitaxial (LTE) SiGe deposition, carbon can also be added to form a LTE SiGe:C layer 72. P-type material will be added such that the resulting layer 72 provides a p-type single crystal emitter 72b for the PNP transistor 4 and a p-type single crystal intrinsic base 72c for the NPN transistor 6.

Figure 11:
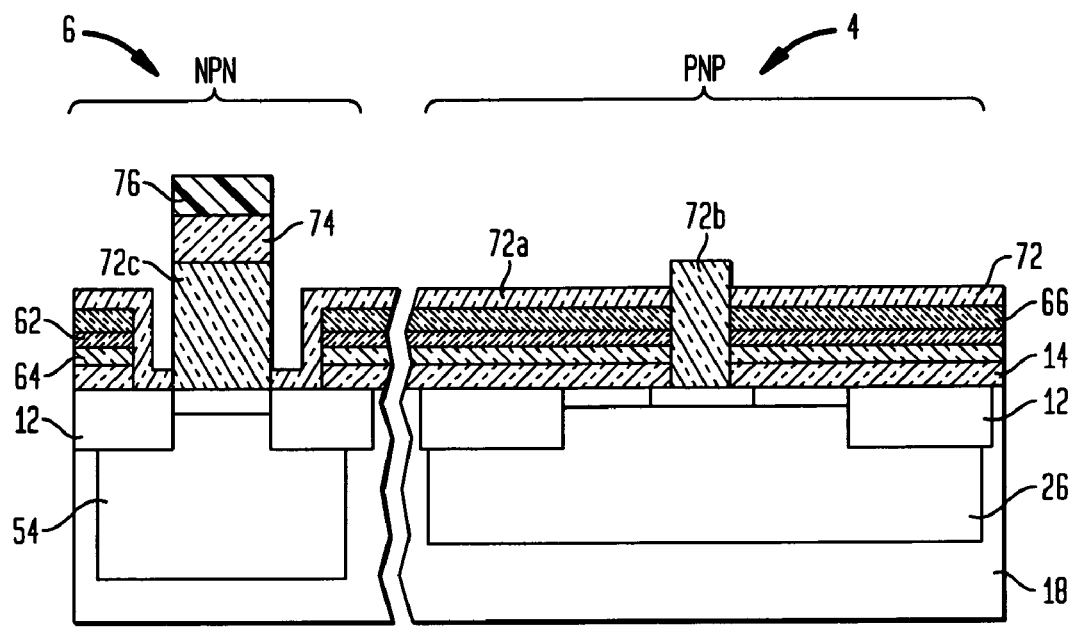
FIG. 11 shows an eleventh step of the inventive method for forming a polysilicon emitter for the vertical NPN transistor, according to one embodiment of the present invention.

A n-type polysilicon emitter 74 is then formed over the p-type single crystal intrinsic base 72c in the NPN transistor 6, and a photoresist layer 76 is provided to selectively cover the emitter 74 and intrinsic base 72c of the NPN transistor 6, as shown in FIG. 11.

Figure 12:
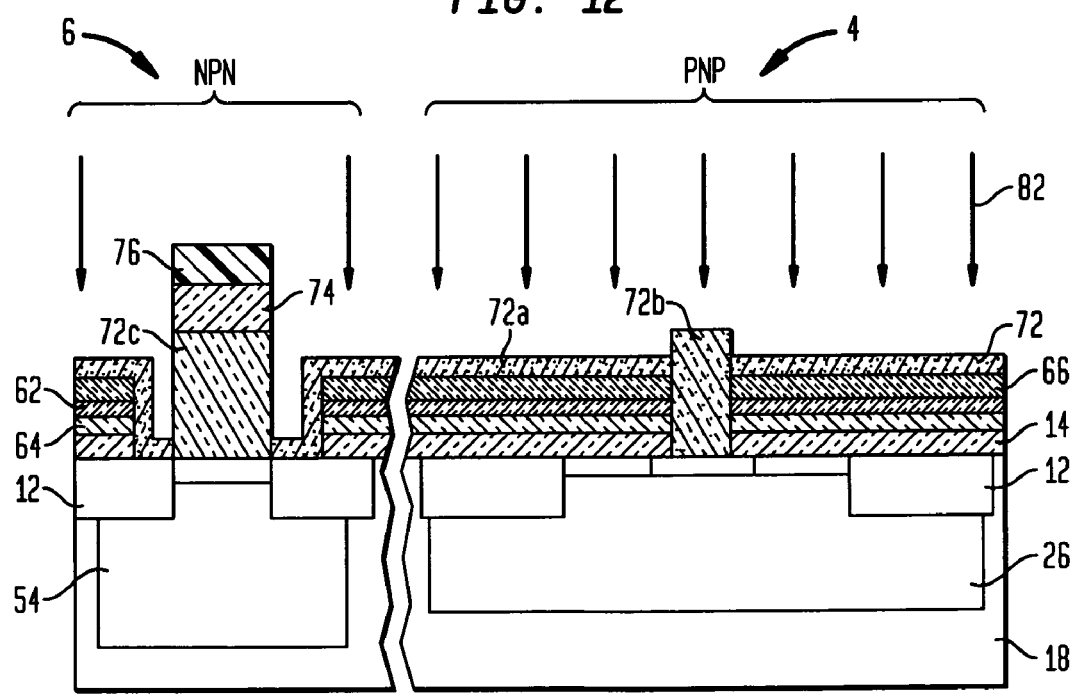
FIG. 12 shows a twelfth step of the inventive method for a p-type ion implantation that concurrently forms a polycrystalline extrinsic base for the vertical NPN transistor and increases doping concentration in the emitter of the vertical PNP transistor, according to one embodiment of the present invention.

Next, a p-type ion implantation step 82 is applied to the PNP transistor 4 and the NPN transistor 6, as shown in FIG. 12. The photoresist 76 covers the emitter 74 and intrinsic base 72c of the NPN transistor 6 to prevent further p-type doping of these structures, while the polysilicon layer 72a flanking the single crystal intrinsic base 72c is further doped with p-type material and therefore forms an extrinsic base 73 for the NPN transistor 6. Concurrently, the single crystal emitter 72b of the PNP transistor is further doped with p-type material so that the doping concentration in the emitter 72b is adjusted to a suitable level as required by the specific application of the device. As a result, doping adjustment for the singly crystal emitter 72b of the PNP transistor 4 is simultaneously accomplished with formation of the polycrystalline extrinsic base 73 for the NPN transistor 6. The resulting structure includes single crystal silicon in the emitter region 72b of the PNP transistor 4, single crystal silicon in the intrinsic base region 72c of the NPN transistor 6, and polycrystalline silicon in the extrinsic base region 73 of the NPN transistor 6.

Figure 13:
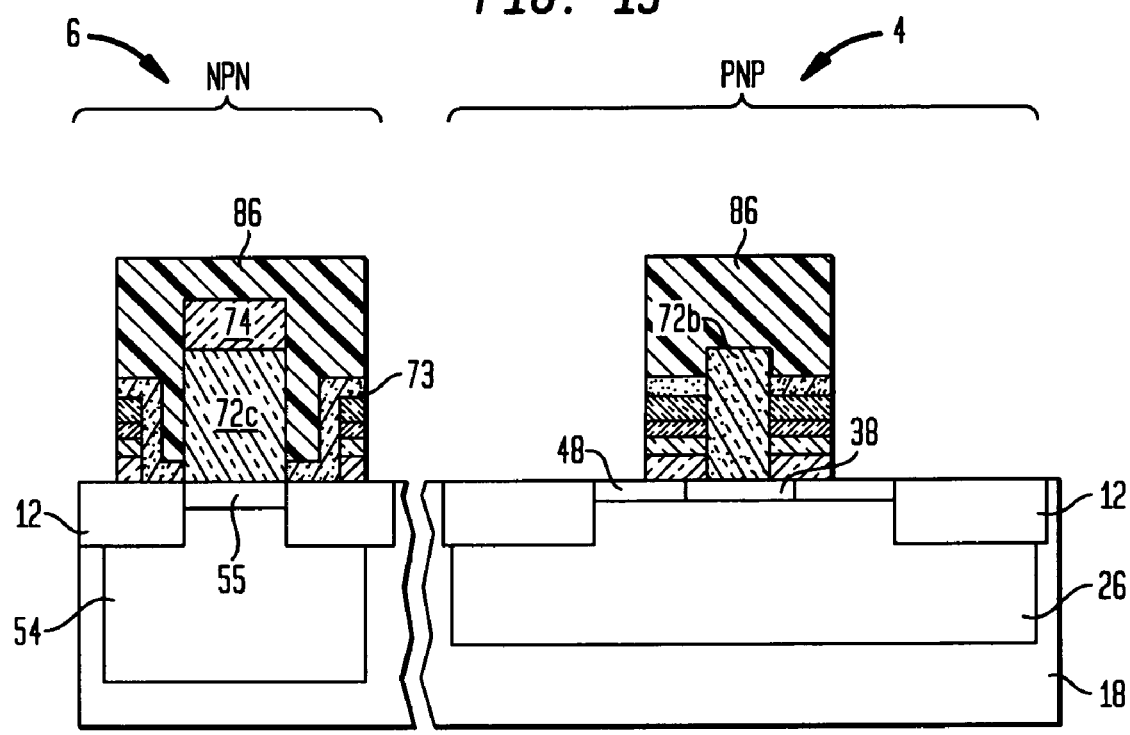
FIG. 13 shows a thirteenth step of the inventive method for defining the base of the vertical NPN transistor and the emitter of the vertical PNP transistor, according to one embodiment of the present invention.

As shown in FIG. 13, the next step involves use of a patterned photoresist layer 86 to selectively etch away a portion of the SiGe polysilicon layer 72a and a portion of the polysilicon seed layer 66, the oxide layer 62, the nitride layer 64, and the oxide layer 14. This selective etching step defines the base of the NPN transistor 6 and the emitter of the PNP transistor 4. Subsequently, the photoresist 86 is removed by stripping.

With reference to FIG. 13, the resulting bipolar transistors 4 and 6 include a single crystal SiGe or SiGeC emitter 72b for the PNP transistor 4 and a single crystal SiGe or SiGeC intrinsic base 72c for the NPN transistor 6, while 72b and 72c are located in a single SiGe or SiGeC layer and are substantially aligned with each other in the lateral direction (i.e., the direction parallel to the substrate surface). The PNP transistor 4 further includes an intrinsic base 38, an extrinsic base 48, and a collector 26. The NPN transistor 6 further includes a polysilicon emitter 74, a polycrystalline SiGe or SiGeC extrinsic base 73, a collector 55, and a sub-collector 54. The resulting PNP transistor 4 demonstrates significantly enhanced performance (e.g., a cutoff frequency $f_T > 1$ GHz) compared to the conventional lateral PNP transistors.

The method of forming PNP transistor 4, as described above, does not include any additional processing step beyond those existing processing steps that have already been used in forming conventional CMOS devices, such as NFETs or PFETs, and conventional bipolar devices, such as NPN transistors. In another embodiment, the method of the present invention may optionally include one additional mask/implant step for tailoring the base and collector profiles of the vertical PNP transistor 4.

While the invention has been described herein with reference to specific embodiments, features and aspects, it will be recognized that the invention is not thus limited, but rather extends in utility to other modifications, variations, applications, and embodiments, and accordingly all such other modifications, variations, applications, and embodiments are to be regarded as being within the spirit and scope of the invention.

What is claimed is:

1. A method for forming a vertical PNP transistor in a semiconductor substrate while forming a CMOS device and a vertical NPN transistor, said method comprising:
   a first step or set of steps for concurrently forming at least a first portion of the CMOS device and a collector region of the vertical PNP transistor;
   a second step or set of steps for concurrently forming at least a second portion of the CMOS device and an intrinsic base region of the vertical PNP transistor;
   a third step or set of steps for concurrently forming at least a third portion of the CMOS device and an extrinsic base region of the vertical PNP transistor; and
   a fourth step or set of steps for concurrently forming at least a portion of the vertical NPN transistor and an emitter region of the vertical PNP transistor, wherein the emitter region of the vertical PNP transistor and an intrinsic base region of the vertical NPN transistor both consist essentially of a single crystal material, wherein an upper surface of the emitter region of the vertical PNP transistor is aligned and co-planar with an upper surface of the intrinsic base region of the vertical NPN transistor along a direction parallel to a top surface of the semiconductor substrate.

2. The method of claim 1, wherein the vertical NPN transistor has an intrinsic base region, and wherein the emitter region of the vertical PNP transistor and the intrinsic base region of the vertical NPN transistor are located in a single silicon germanium-containing layer.

3. The method of claim 1, wherein the collector region of the vertical PNP transistor is formed by a p-type ion implantation step that concurrently forms p-well implants for the CMOS device.

4. The method of claim 1, wherein the CMOS device comprises a NFET, and wherein the intrinsic base region of the vertical PNP transistor is formed by an n-type ion implantation step that concurrently forms extension implants for the NFET.

5. The method of claim 1, wherein the CMOS device comprises a PFET, and wherein the intrinsic base region of the vertical PNP transistor is formed by a halo implantation step that concurrently forms halo implants for the PFET.

6. The method of claim 1, wherein the intrinsic base region of the vertical PNP transistor is formed by an n-type ion implantation step that forms collector pedestal implants for the vertical NPN transistor.

7. The method of claim 1, wherein the CMOS device comprises a NFET, the extrinsic base region of the vertical PNP transistor is formed by an n-type ion implantation step that concurrently forms source/drain implants for the NFET.

8. The method of claim 1, wherein the single crystal material of the emitter region is made of a single crystal SiGe material, and the single crystal material of the intrinsic base region is made of a single crystal SiGe material.

9. The method of claim 1, wherein the emitter region of the vertical PNP transistor is formed by one or more steps that forms the intrinsic base region of the vertical NPN transistor.

10. The method of claim 9, wherein an etch window in the emitter region of the vertical PNP transistor is formed by a selective etching step that forms an etch window in the intrinsic base region of the vertical NPN transistor.

11. The method of claim 10, wherein a single silicon germanium-containing layer is epitaxially grown over single crystal substrates exposed through said etch windows to form a single crystal emitter in the emitter region of the vertical PNP transistor and a single crystal intrinsic base in the intrinsic base region of the vertical NPN transistor.

12. The method of claim 11, wherein said single silicon germanium-containing layer epitaxially grows over polycrystalline substrates outside the emitter region of the vertical PNP transistor and the intrinsic base region of the vertical NPN transistor to form polycrystalline structures outside said emitter region and said base region.

13. The method of claim 11, wherein doping concentration in the single crystal emitter of the vertical PNP transistor is increased by a p-type ion implantation that forms an extrinsic base for the vertical NPN transistor.

* * * * *